(12) United States Patent
Huang et al.

(10) Patent No.: US 11,961,774 B2
(45) Date of Patent: Apr. 16, 2024

(54) SEMICONDUCTOR DEVICE AND METHOD FOR MANUFACTURING SAME

(71) Applicant: CHANGXIN MEMORY TECHNOLOGIES, INC., Hefei (CN)

(72) Inventors: Chen Huang, Hefei (CN); Meng-Feng Tsai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 421 days.

(21) Appl. No.: 17/446,956

(22) Filed: Sep. 3, 2021

(65) Prior Publication Data
US 2022/0077008 A1 Mar. 10, 2022

Related U.S. Application Data

(63) Continuation of application No. PCT/CN2021/100228, filed on Jun. 16, 2021.

(30) Foreign Application Priority Data

Sep. 4, 2020 (CN) .......................... 202010922723.2

(51) Int. Cl.
| | | |
|---|---|---|
| H01L 21/66 | (2006.01) | |
| H01L 23/522 | (2006.01) | |
| H10B 12/00 | (2023.01) | |

(52) U.S. Cl.
CPC .......... *H01L 22/32* (2013.01); *H01L 23/5226* (2013.01); *H10B 12/09* (2023.02); *H10B 12/50* (2023.02)

(58) Field of Classification Search
CPC ..... H01L 22/32; H01L 23/5226; H01L 22/34; H10B 12/09; H10B 12/50
See application file for complete search history.

(56) References Cited

U.S. PATENT DOCUMENTS 6,410,353 B1 * 6/2002 Tsai ........................ H01L 22/14
257/107
6,734,458 B2 5/2004 Kim
(Continued)

FOREIGN PATENT DOCUMENTS

| CN | 103325806 A | 9/2013 |
|---|---|---|
| CN | 205231023 U | 5/2016 |

(Continued)

OTHER PUBLICATIONS

International Search Report in the international application No. PCT/CN2021/101270, dated Aug. 30, 2021.
(Continued)

*Primary Examiner* — Allison Bernstein
(74) *Attorney, Agent, or Firm* — Syncoda LLC; Feng Ma (57) ABSTRACT

A semiconductor device includes a semiconductor substrate. The semiconductor substrate includes multiple chip regions and a strip line for separating the chip regions. A test key is formed in the strip line and is used for a bit line contact (BLC) resistance test. The test key includes active regions and connecting structures. The active regions are formed in the semiconductor substrate. The connecting structures are located at ends of the active regions. The multiple active regions located on the same column are sequentially connected end to end by the connecting structures.

13 Claims, 5 Drawing Sheets

(56) References Cited

U.S. PATENT DOCUMENTS

| | | | |
|---|---|---|---|
| 6,856,562 B2* | 2/2005 | Lachenmann | H10B 12/0385 |
| | | | 365/201 |
| 6,992,327 B2 | 1/2006 | Tone | |
| 7,847,288 B2 | 12/2010 | Kwon | |
| 8,878,293 B2 | 11/2014 | Jang et al. | |
| 8,933,427 B2 | 1/2015 | Yi | |
| 9,881,924 B2 | 1/2018 | Wang et al. | |
| 10,163,909 B2 | 12/2018 | Wang et al. | |
| 10,566,332 B2 | 2/2020 | Wang et al. | |
| 2003/0100134 A1 | 5/2003 | Kim | |
| 2003/0222260 A1 | 12/2003 | Tone | |
| 2013/0248798 A1 | 9/2013 | Yi | |
| 2013/0264638 A1 | 10/2013 | Jang et al. | |
| 2015/0123130 A1* | 5/2015 | Liao | H01L 29/78 |
| | | | 257/48 |
| 2017/0330882 A1 | 11/2017 | Wang et al. | |
| 2018/0102366 A1 | 4/2018 | Wang et al. | |
| 2019/0088658 A1 | 3/2019 | Wang et al. | |

FOREIGN PATENT DOCUMENTS

| | | |
|---|---|---|
| CN | 205609515 U | 9/2016 |
| CN | 110071108 A | 7/2019 |
| CN | 110335861 A | 10/2019 |
| KR | 20000027539 A | 5/2000 |
| KR | 20020002734 A * | 1/2002 |

OTHER PUBLICATIONS

International Search Report in the international application No. PCT/CN2021/100228, dated Aug. 26, 2021.

* cited by examiner

SEMICONDUCTOR DEVICE AND METHOD FOR MANUFACTURING SAME

CROSS-REFERENCE TO RELATED APPLICATIONS

The present application is a continuation of International Application No. PCT/CN2021/100228 filed on Jun. 16, 2021, which claims priority to Chinese Patent Application No. 202010922723.2 filed on Sep. 4, 2020. The disclosures of these applications are hereby incorporated by reference in their entirety.

BACKGROUND

Statement here merely provides background information related to the present application and does not necessarily constitute the existing technology.

With the size of semiconductor devices miniaturizing, compared with the manufacturing process of a 19 nm Dynamic Random-Access Memory (DRAM), the manufacturing process of a 17 nm DRAM is characterized in that the size of transistors in storage unit array regions and peripheral circuit regions is smaller, and the process complexity is higher. In order to monitor the manufacturing process of semiconductor devices to ensure the reliability of semiconductor devices, it is common practice to form a test key in semiconductor devices for testing and simulating some critical parameters of semiconductor devices to ensure the outgoing quality of semiconductor devices.

SUMMARY

The present application relates generally to the technical field of semiconductor storage devices, and more specifically to a semiconductor device and a method for manufacturing the same.

According to various embodiments of the present disclosure, a semiconductor device and a method for manufacturing the same are provided.

A semiconductor device includes a semiconductor substrate and test keys. The semiconductor substrate includes multiple chip regions and strip lines for separating the chip regions.

The test keys for testing a bit line contact resistance are formed in the strip lines, and test key includes active regions and connecting structures.

The active regions are located in the semiconductor substrate.

The connecting structures are located at ends of the active regions, and the active regions located on a same column are sequentially connected end to end by the connecting structures.

A method for manufacturing a semiconductor device includes the following steps.

A semiconductor substrate is provided.

Multiple chip regions and strip lines for separating the chip regions are formed on the semiconductor substrate, in which multiple active regions formed synchronously with the chip regions are provided in the strip lines.

Multiple connecting structures located at ends of the active regions are formed, and multiple active regions on a same column are sequentially connected end to end by the connecting structures.

The active regions and the connecting structures jointly constitute test keys for testing a bit line contact (BLC) resistance.

The details of one or more embodiments of the present disclosure are set forth in the accompanying drawings and the description below. Other features, objectives, and advantages of the present application will be apparent from the specification, the accompanying drawings, and the claims.

BRIEF DESCRIPTION OF THE DRAWINGS

To describe the technical solutions in the examples or exemplary technologies of the present disclosure more clearly, the following briefly introduces the accompanying drawings required in the examples or the exemplary technologies. It is apparent to those of ordinary skill in the art that the drawings in the following description are only some examples of this disclosure, and that the drawings of other examples can be obtained from these drawings without involving any inventive effort.

REFERENCE NUMERALS

10—chip region; 20—strip line; 200—test key; 210—active region; 220—connecting structure; 221—first connecting plug; 222—second connecting plug; 223—metal layer; 224—metal barrier layer; 230—insulating layer; 240—filling layer; 250—shallow trench isolation structure; 30—semiconductor substrate.

DETAILED DESCRIPTION

In order that the above objectives, features, and advantages of the present disclosure can be more readily understood, specific implementation modes of the present disclosure will now be described in detail with reference to the accompanying drawings. In the following description, numerous specific details are set forth in order to provide a thorough understanding to the present disclosure. The present disclosure can, however, be implemented in many other modes different from those described herein. Similar modifications can be made by those skilled in the art without departing from the spirit of the present disclosure, and therefore the present disclosure is not limited to specific examples disclosed below.

It should be understood that when an element or layer is referred to as being "on", "adjacent to", "connected to", or "coupled to" another element or layer, the element or layer may be directly on, adjacent to, connected to, or coupled to another element or layer, or an intervening element or layer may be present. In contrast, when an element is referred to as being "directly on", "directly adjacent to", "directly connected to", or "directly coupled to" another element or layer, there is no intervening element or layer present. It should be understood that although the terms first, second, third, etc. may be used to describe various elements, components, regions, layers, doping types, and/or portions, these elements, components, regions, layers, doping types, and/or portions should not be limited by these terms. These terms are used merely to distinguish one element, component, region, layer, doping type, or portion from another element, component, region, layer, doping type, or portion. Therefore, a first element, component, region, layer, doping type, or portion discussed below may be represented as a second element, component, region, layer, or portion without departing from the teachings of the present disclosure. For example, a first doping type may be referred to as a second doping type, and similarly, a second doping type may be referred to as a first doping type. The first doping type and the second doping type are different doping types. For example, the first doping type may be P-type and the second doping type may be N-type, or the first doping type may be N-type and the second doping type may be P-type.

Spatially relational terms such as "below", "under", "lower", "beneath", "above", and "upper" may be used herein to describe a relationship between one element or feature and another element or feature illustrated in the figures. It should be understood that in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. In addition, the devices may also include additional orientations (e.g., rotation for 90 degrees or other orientations), and the spatial descriptors used herein may be interpreted accordingly.

As used herein, the singular forms "a/an", "one", and "the" may further include the plural referents as well, unless the context clearly dictates otherwise. It should also be understood that the terms "comprising/including" or "having", etc. specify the presence of stated features, integers, steps, operations, components, portions, or combinations thereof, but do not preclude the possibility of the presence or addition of one or more other features, integers, steps, operations, components, portions, or combinations thereof. Also, in the present specification, the term "and/or" includes any and all combinations of the associated listed items.

Testing of critical parameters of semiconductor devices can include resistance testing of semiconductor devices, etc. For example, by performing a Bit Line Contact (BLC) resistance test, it can be tested whether the contact between a BLC plug and a substrate is good. However, since a shallow trench isolation structure is located between active regions when a current BLC resistance test key performs testing, the BLC resistance is also abnormally high when the shallow trench isolation structure in the active regions in the substrate is abnormal, and therefore the contact condition between the BLC plug and the substrate cannot be accurately reflected.

Figure 1:
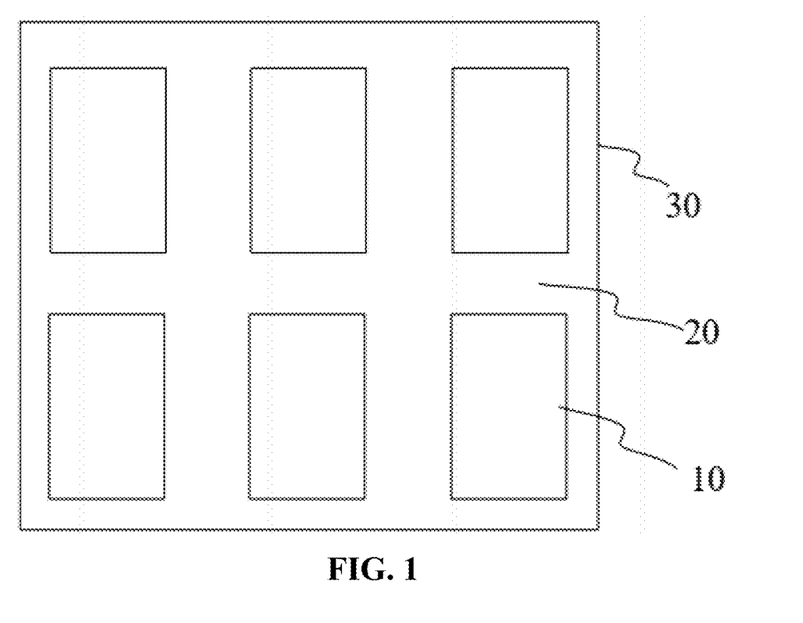
FIG. 1 is a top view of a semiconductor device including chip regions and strip lines.
Figure 2:
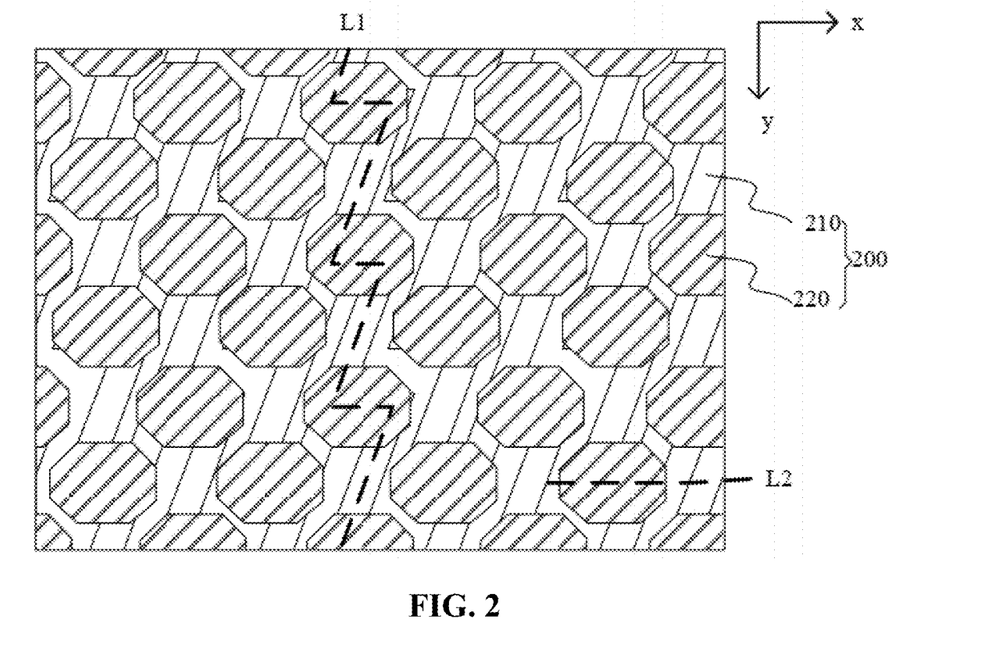
FIG. 2 is a top view of a semiconductor device according to an example of the present disclosure.

An example of the present disclosure provides a semiconductor device including a semiconductor substrate, referring to FIGS. 1 and 2. The semiconductor substrate 30 includes multiple chip regions 10 and strip lines 20 for separating the chip regions 10. Test keys 200 are formed in the strip lines 20. A test key 200 includes active regions 210 and connecting structures 220. The active regions 210 are formed in the semiconductor substrate 30. The connecting structures 220 are located at ends of the active regions 210. Multiple active regions 210 located on the same column are sequentially connected end to end by the connecting structures 220. The test keys 200 are used for testing a BLC resistance.

It should be understood that the test key 200 of the semiconductor device is generally manufactured in the same process as the semiconductor device in the semiconductor substrate 30, and that the test key 200 of the semiconductor device and the semiconductor device have a mutual correspondence: interconnection lines at each layer in the semiconductor device corresponds to a test line at the same layer in the test key 200 of the semiconductor device, and each BLC plug in the semiconductor device corresponds to one connecting plug at the same layer in the test key 200 of the semiconductor device. Therefore, the test key 200 is formed simultaneously within the strip line 20 when a BLC plug and a bit line connecting line are formed in the present example. The test key 200 includes active regions 210 and connecting structures 220. The active regions 210 are formed in the semiconductor substrate 30. The connecting structures 220 are located at ends of the active regions 210. Multiple active regions 210 located on the same column are sequentially connected end to end by the connecting structures 220.

Since multiple active regions 210 located on the same column are sequentially connected end to end by the connecting structures 220 located at the ends of the active regions 210 in the present example, as shown by black dotted lines in FIG. 2, that is, bit line contact (BLC) holes are connected in series with the active regions, and the sum of the resistance values of multiple bit line contact (BLC) resistors and active region resistors located on the same column is finally obtained by testing. The sum of the resistance values of the BLC resistors can be accurately obtained by subtracting resistance value of the active regions as the test result obtained by another test method from the sum of the resistance values. Said another test method includes obtaining the sum of resistance of the active regions that are connected in series by testing. Detailed descriptions are omitted herein. Therefore, the technical solution effectively solves the problem of inaccurate measurement of the BLC resistance caused by abnormal shallow trench isolation structures, thereby improving the test accuracy and further improving the product quality.

Figure 4:
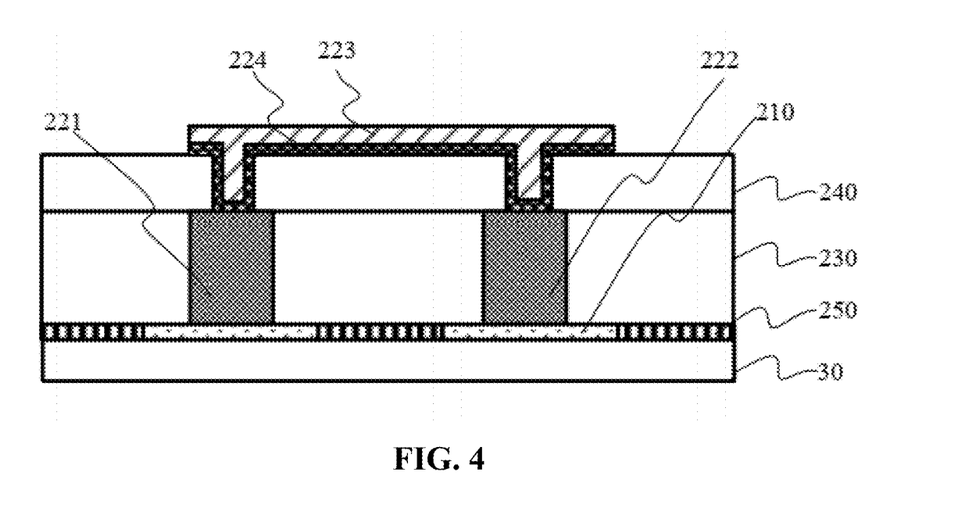
FIG. 4 is a cross-sectional view of the semiconductor device taken along dashed line L2 in FIG. 2.

Referring to FIG. 4, in one example, the connecting structure 220 includes a first connecting plug 221, a second connecting plug 222, and a metal layer 223. The first connecting plug 221 is located at a head end of an active region 210. The second connecting plug 222 is located at a tail end of the active region 210. The metal layer 223 is located above the first connecting plug 221 and the second connecting plug 222. The first connecting plug 221 and the second connecting plug 222 are connected by the metal layer 223.

Figure 3:
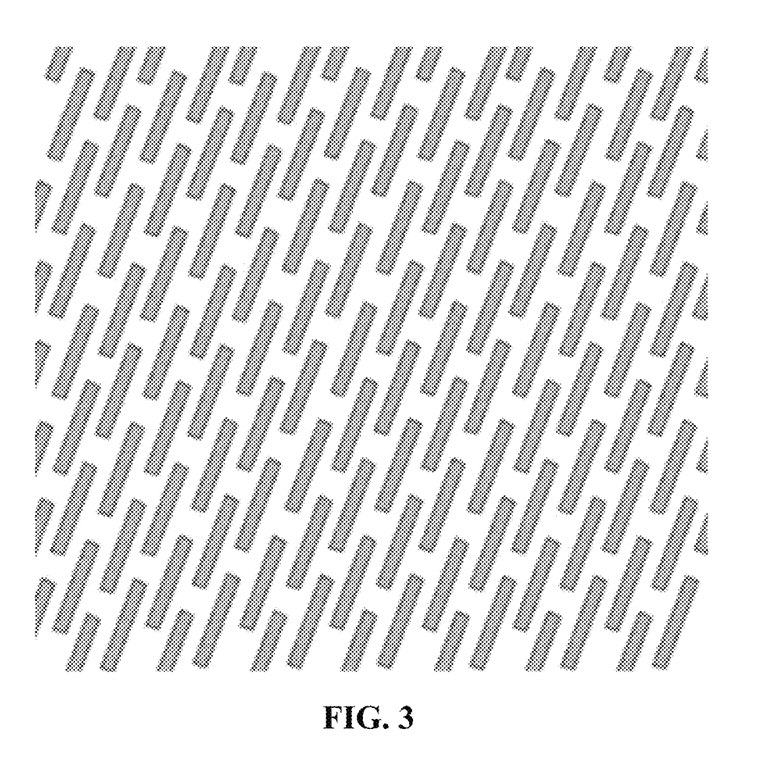
FIG. 3 is a schematic diagram of an exemplary arrangement of active regions of a semiconductor device.

It should be understood that the semiconductor substrate 30 includes a base and shallow trench structures (not shown) formed in the base. Multiple active regions 210 which are staggered and arranged in parallel are defined by the shallow trench structures, and an insulating material is filled in the shallow trench structures to form a shallow trench isolation structure 250. As shown in FIG. 3, strip-shaped regions in the figure are active regions and the rest is the shallow trench isolation structure. The semiconductor substrate 30 further includes a word line structure (not shown) and a bit line structure (not shown). The word line structure is an embedded word line structure. The extending direction of the embedded word line structure intersects with the extending direction of the bit line structure. The bit line structure includes a bit line contact (BLC) plug, a bit line, and an insulating layer, which are stacked from bottom up. "From bottom up" means a direction away from the base. The bottom of the BLC plug is located on the base and is in direct contact with the base. After the bit line structure is formed, multiple bit lines are connected by the connecting structures 220.

To facilitate testing of the BLC resistance, the test key 200 is formed in the strip line 20 while the bit line structure is formed, as shown in FIGS. 2 and 4. The test key 200 includes the active regions 210 and the connecting structures 220. The first connecting plug 221 is located at a head end of the active region 210. The second connecting plug 222 is located at a tail end of the active region 210. The first connecting plug 221 and the second connecting plug 222 have the same structure and both include a non-metal conductive layer. In the present example, the metal layer 223 may be formed by stacking any one or any combination of titanium nitride, titanium, copper, tungsten silicide and tungsten nitride with tungsten. The non-metal conductive layer is formed of polycrystalline silicon, a semiconductor conductive material, etc. In the present example, multiple active regions 210 are staggered. The extending direction of the active regions 210 has a certain included angle with a row direction (x direction as shown in FIG. 2). The active regions are aligned in a column direction. The head of each of multiple active regions 210 located on the same column and the tail nearest thereto are connected to the metal layer 223 by a first contact plug or a second contact plug. The metal layer 223 is a test line of a BLC resistance test key.

Generally, the first connecting plug 221 and the second connecting plug 222 are formed of polycrystalline silicon. The metal layer 223 is formed of metal tungsten. In one example, in order to prevent metal atoms from diffusing into a polycrystalline silicon material layer, the connecting structure further includes a metal barrier layer 224. The metal barrier layer 224 is located between the first connecting plug and the metal layer and between the second connecting plug and the metal layer. The metal barrier layer is formed of titanium nitride in the present example. Metal atoms in the metal layer 223 may be blocked from diffusing into the polycrystalline silicon layer by the metal barrier layer 224.

In one example, multiple active regions 210 located on the same column and multiple connecting structures 220 jointly constitute a "Z"-shaped test key 200 along dashed line L1.

With continued reference to FIG. 2, an included angle between the extending direction of the active regions 210 and the row direction in the present example is in the range of 60°-80°, so that in the case of not affecting the number and size of the active regions 210, multiple active regions 210 can be aligned in the column direction, the distance between the head end and the tail end of two adjacent active regions 210 in the column direction is shortest, and the corresponding connecting structures 220 are also arranged along y direction, thereby simplifying the manufacturing process. In the present example, contact resistors located on the same column are connected in series by the test key 200, thereby solving the problem that the test accuracy is reduced due to abnormal shallow trench isolation structures.

In one example, every two adjacent active regions 210 are connected in a direction along which the active regions 210 extend.

It should be understood that larger size (mainly referred to the length of the active region) of active regions which are staggered and arranged in parallel are firstly formed in a semiconductor substrate generally, and are then segmented by using a two-layer cutting mask to form multiple small-sized active regions which are spaced apart. However, in the strip line, only one-layer cutting mask can be used, therefore the small-sized active regions to be formed cannot be completely separated. So every two adjacent active regions are connected in the direction in which the active regions extend.

In one example, the test key 200 is one of multiple test keys 200 in the strip line 20. It will be appreciated that the test key 200 of the semiconductor device is manufactured in the same process as the semiconductor device in the semiconductor substrate, and that the test key 200 of the semiconductor device and the semiconductor device have a mutual correspondence. Therefore, each layer of interconnection lines in the semiconductor device may correspond to one test key 200. The testing of critical parameters of the semiconductor device includes the resistance testing of the semiconductor device, the thickness testing of a dielectric layer, the testing of a relative position between the semiconductor devices, etc., thus multiple test keys 200 having different uses are provided in the strip line 20. The above-described test key 200 including the active regions 210 and the connecting structures 220 is only one of multiple test keys 200 in the strip line 20.

In one example, the chip region 10 is a semiconductor memory chip, i.e. the chip region 10 includes a semiconductor memory chip region. In the present example, the chip region 10 is a region where a semiconductor memory chip is formed, the semiconductor device is a semiconductor memory, and the test key 200 is used to test BLC resistance in the semiconductor memory, and then the quality of the semiconductor memory is detected according to a measured BLC resistance. Since the multiple active regions 210 located on the same column are sequentially connected end to end by the test key 200 in the present example, a sum of the resistance values of multiple BLC resistors and active region resistors is obtained. The sum of the resistance values of the BLC resistors can be accurately obtained by subtracting resistance value test results of the active regions obtained by using other test method from the sum of the resistance values of multiple BLC resistors and active region resistors. Accordingly, the problem that the test accuracy is reduced due to abnormal shallow trench isolation structures can be avoided, improving the test accuracy, and the device quality can be improved.

Figure 5:
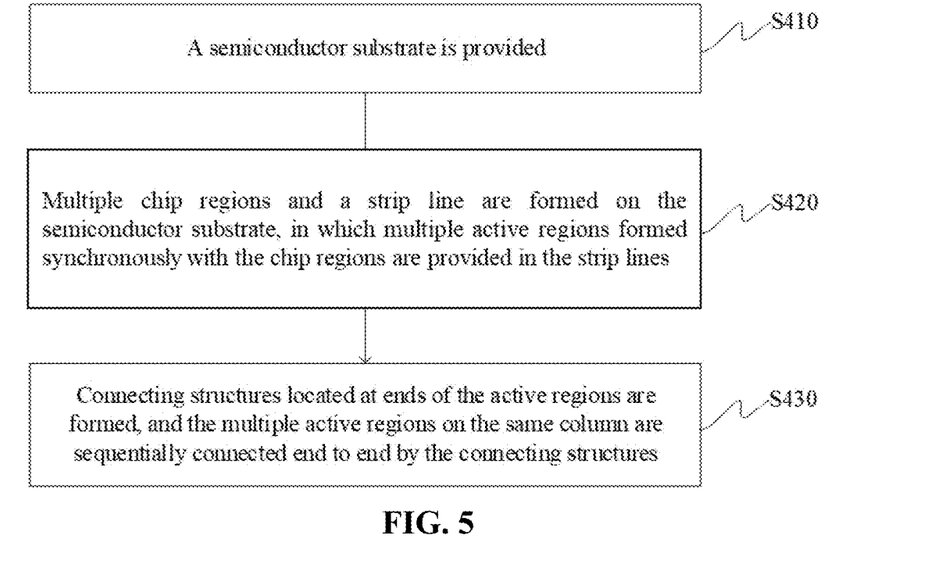
FIG. 5 is a flowchart of a method for manufacturing a semiconductor device according to an example of the present disclosure.

Based on the same inventive concept, an example of the present application also provides a method for manufacturing a semiconductor device. Referring to FIG. 5, the method for manufacturing a semiconductor device includes the following steps.

At S410, a semiconductor substrate 30 is provided.

At S420, multiple chip regions 10 and strip lines for separating the chip regions are formed on the semiconductor substrate 30. Multiple active regions 210 formed synchronously with the chip regions 10 are provided in the strip line.

At S430, multiple connecting structures 220 are formed. The connecting structures 220 are located at ends of the active regions 210. The multiple active regions 210 on the same column are sequentially connected end to end by the connecting structures 220. The active regions and the connecting structures jointly constitute a test key for a BLC resistance test.

The test key 200 of the semiconductor device is generally manufactured in the same process as the semiconductor device in the semiconductor substrate, and the test key 200 of the semiconductor device and the semiconductor device have a mutual correspondence: interconnection lines at each layer in the semiconductor device corresponds to the test line (i.e. the metal layer 223 in the semiconductor structure) at the same layer in the test key 200 of the semiconductor device, and each BLC plug in the semiconductor device corresponds to one connecting plug (i.e. the first connecting plug or the second connecting plug in the semiconductor structure) at the same layer in the test key 200 of the semiconductor device. Therefore, the test key 200 is formed simultaneously within the strip line 20 when a BLC plug and a bit line connecting line are formed in the present example. The test key 200 includes active regions 210 and connecting structures 220. The active regions 210 are formed in the semiconductor substrate 30. The connecting structures 220 are located at ends of the active regions 210. Multiple active regions 210 located on the same column are sequentially connected end to end by the connecting structures 220.

The multiple active regions 210 located on the same column are sequentially connected end to end by the connecting structures 220 located at ends of the active regions 210 in the present example, and then the sum of the values of multiple BLC resistances and resistance values of active regions located on the same column is obtained. The sum of the values of the BLC resistances can be accurately obtained by subtracting resistance value test results of the active regions obtained using other test methods from the sum of the values of multiple BLC resistances and the resistance values of active region. Therefore, the problem of inaccurate measurement of the BLC resistance caused by abnormal shallow trench isolation structures is effectively solved, thereby improving the test accuracy, and the product quality is further improved.

In one example, the step of forming the connecting structure 220 includes the following operations.

An insulating layer 230 is formed above the active region.

A first connecting plug 221 and a second connecting plug 222 which penetrate through the insulating layer 230 are formed. The first connecting plug 221 is located at a head end of the active region 210. The second connecting plug 222 is located at a tail end of the active region 210.

A metal layer 223 is formed. The metal layer 223 covers the first connecting plug 221 and the second connecting plug 222. The first connecting plug 221 and the second connecting plug 222 are connected by the metal layer 223.

The semiconductor device in the present example is a semiconductor memory. The semiconductor substrate 30 includes a base and shallow trench structures (not shown) formed in the base. Multiple active regions 210 which are staggered and arranged in parallel are defined by the shallow trench structures, and an insulating material is filled in the shallow trench structures to form a shallow trench isolation structure. In one example, every two adjacent active regions are connected in a direction along which the active regions extend. It will be appreciated that larger size (mainly referred to the length of the active region) of active regions which are staggered and arranged in parallel are firstly formed in a semiconductor substrate generally, and are then segmented by using a two-layer cutting mask to form multiple small-sized active regions which are spaced apart. However, in the strip line, only one-layer cutting mask can be used, so that the small-sized active regions to be formed cannot be completely separated. Therefore, every two adjacent active regions are connected in the direction along which the active regions extend.

The substrate further includes a word line structure (not shown) and a bit line structure (not shown). The word line structure is an embedded word line structure. The extending direction of the embedded word line structure intersects with the extending direction of the bit line structure. The bit line structure includes a BLC plug, a bit line, and an insulating layer 230, which are stacked from bottom up. "From bottom up" means a direction away from the base. The bottom of the BLC plug is located on the semiconductor substrate and is in direct contact with the semiconductor substrate. After the bit line structure is formed, multiple bit lines are connected by the connecting structures 220. The test key 200 is formed synchronously with the bit line structure and the connecting structures 220, the specific forming process includes the following operations.

In operation 1, an insulating material, such as silicon nitride, silicon oxide, or silicon oxynitride, is deposited by a deposition process to form an insulating layer 230 covering the surface of the semiconductor substrate (including active regions 210 and a shallow trench isolation structure 250). The deposition process may include chemical vapor deposition (CVD), low pressure CVD (LPCVD), plasma enhanced CVD (PECVD), atomic layer deposition (ALD), plasma enhanced ALD (PEALD), etc.

In operation 2, when a BLC hole is formed, through holes for forming the first connecting plug 221 and the second connecting plug 222 are synchronously formed in the strip line 20 by using an etching process, and the through holes expose the active region 210.

Then, polycrystalline silicon materials are sequentially deposited by using a deposition process to form a polycrystalline silicon material layer which covers the insulating layer 230 and fills the through holes.

In operation 3, the polycrystalline silicon material layer is etched to remove the polycrystalline silicon material layer located on the insulating layer 230, and a first connecting plug and a second connecting plug are formed in the strip line 20 by the retained polycrystalline silicon material layer. In the present example, both the first connecting plug and the second connecting plug are located in the through holes and fill the through holes.

In operation 4, a bit line connecting structure is formed in the chip region 10 by a Periphery Contact (PC) process, and metal layers in the bit line structure are connected together by the connecting structure 220. Also, a metal layer 223 connecting the first connecting plug and the second connecting plug is synchronously formed. Operation 4 specifically can include the following operations.

Firstly, after forming a bit line structure, a bit line isolation structure covering a side surface of the bit line structure is formed by a deposition and etching process. The operation specifically includes the following. Firstly, an isolation material layer covering the surface of the bit line structure and the surface of the substrate is formed by depositing an insulating material. In the present example, the isolation material layer is made of silicon nitride. Then, the isolation material layer is etched by using an etching process, so that the isolation material layer on the top of the bit line structure and the surface of the substrate is removed and the isolation material layer on a side wall of the bit line structure is retained as the bit line isolation structure (not shown).

Secondly, after forming the bit line isolation structure, a filling layer 240 is formed by using a deposition process and an etching/chemical mechanical polishing process. The filling layer 240 is formed by depositing a silicon nitride material in the present example.

Then, the metal layer 223 is formed by a PC process. The metal layer 223 covers the first connecting plug 221 and the second connecting plug 222. The first connecting plug 221 and the second connecting plug 222 are connected by the metal layer 223. In some other examples, before the metal layer is formed, the method further includes the step of forming a metal barrier layer. The metal barrier layer is located between the first connecting plug and the metal layer and between the second connecting plug and the metal layer.

The metal barrier layer is formed of titanium nitride in the present example. Metal atoms in the metal layer 223 can be blocked from diffusing into the polycrystalline silicon layer by the metal barrier layer 224.

In one example, the multiple active regions 210 located on the same column and the multiple connecting structures 220 jointly constitute a "Z"-shaped test key 200 along dashed line L1. An included angle between the extending direction of the active regions 210 and the row direction in the present example is in the range of 60°-80°, so that in the case of not affecting the number and size of the divided active regions 210, multiple active regions 210 can be aligned in the column direction (y direction as shown in FIG. 2), the distance between the head end and the tail end of two adjacent active regions 210 in the column direction is shortest, and the corresponding connecting structures 220 are also arranged along y direction, thereby simplifying the manufacturing process. Bit line contact resistors and active regions located on the same column are connected in series by the test key 200 in the present example, and then the sum of the resistance values of multiple BLC resistors and active regions located on the same column is obtained by testing. The sum of the resistance values of BLC holes can be accurately obtained by subtracting the resistance value test results of the active regions obtained using other test methods from the sum of the resistance values of multiple BLC resistors and active regions, thereby solving the problem that the test accuracy of the BLC resistance values is reduced due to abnormal shallow trench isolation structures.

In summary, the examples of the present application provide a semiconductor device and a method for manufacturing the same. The semiconductor device includes a semiconductor substrate 30. The semiconductor substrate 30 includes multiple chip regions 10 and strip lines 20 for separating the chip regions 10. Test keys 200 are formed in the strip lines. The test key 200 includes active regions 210 and connecting structures 220. The active regions 210 are formed in the semiconductor substrate 30. The connecting structures 220 are located at ends of the active regions 210. The multiple active regions 210 located on the same column are sequentially connected end to end by the connecting structures 220. In the present example, the semiconductor device is provided with test keys 200 for testing a BLC resistance in the strip lines 20, the multiple active regions 210 located on the same column are sequentially connected end to end by the connecting structures 220 located at the ends of the active regions 210, i.e. BLC holes are connected in series with the active regions, and then the sum of resistance values of multiple BLC resistors located on the same column is obtained. The sum of resistance values of the BLC holes can be accurately obtained by subtracting the resistance value test results of the active regions obtained using other test methods from the sum of resistance values of multiple BLC resistors located on the same column, solving the problem of inaccurate measurement of the BLC resistance value caused by abnormal shallow trench isolation structures, and improving the test accuracy, and further the product quality is improved.

The technical features of the above-described examples may be combined arbitrarily. In order to simplify the description, all possible combinations of the technical features in the above examples are not completely described. However, as long as there is no conflict among the combinations of these technical features, they should be considered to be within the scope of this specification.

The above-described examples describe only a few examples of the present disclosure, and the descriptions are specific and detailed, but cannot therefore be construed to limit the scope of the present disclosure. It should be noted that those of ordinary skill in the art may further make several variations and improvements without departing from the conception of the present disclosure, which fall within the protection scope of the present disclosure. Therefore, the protection scope of the present disclosure should be subject to the appended claims.

What is claimed is:

1. A semiconductor device, comprising:
   a semiconductor substrate, comprising a plurality of chip regions and strip lines for separating the chip regions, wherein test keys are formed in the strip lines, among which each of the test keys comprises:
   a plurality of active regions, disposed in the semiconductor substrate, staggered and arranged in parallel, wherein an extending direction of the plurality of active regions has an included angle in the range of 60°-80° with a row direction; and
   a plurality of connecting structures, disposed at ends of the plurality of active regions, the plurality of active regions aligned on a same column being sequentially connected end to end by the plurality of connecting structures, one of the plurality of active regions and corresponding connecting structures disposed at a head end and a tail end of the one of the plurality of active regions jointly constitute a "Z"-shaped test key in a column direction.

2. The semiconductor device according to claim 1, wherein
   a connecting structure comprises:
   a first connecting plug, located at a head of a first active region;
   a second connecting plug, located at a tail of a second active region; and
   a metal layer, located above the first connecting plug and the second connecting plug and configured to connect the first connecting plug and the second connecting plug,
   wherein the first and second active regions are adjacent with each other and located in a same column.

3. The semiconductor device according to claim 2, wherein
   the connecting structure further comprises: a metal barrier layer, located between the first connecting plug and the metal layer and between the second connecting plug and the metal layer.

4. The semiconductor device according to claim 2, wherein
   the first connecting plug and the second connecting plug have a same structure.

5. The semiconductor device according to claim 2, wherein
   a material of the first connecting plug and the second connecting plug comprises polycrystalline silicon, and a material of the metal layer comprises metal tungsten.

6. The semiconductor device according to claim 2, wherein
   the semiconductor substrate comprises: a base; and shallow trench structures formed in the base, which define the plurality of active regions which are staggered and arranged in parallel, and are filled with an insulating material to form a shallow trench isolation structure.

7. The semiconductor device according to claim 6, wherein every two adjacent active regions are connected in a direction along which the plurality of active regions extend.

8. The semiconductor device according to claim 1, wherein
the test key is one of the test keys in the strip lines.

9. The semiconductor device according to claim 1, wherein
the chip regions comprise semiconductor memory chip regions.

10. A method for manufacturing a semiconductor device, comprising steps of:
providing a semiconductor substrate;
forming a plurality of chip regions and strip lines for separating the chip regions on the semiconductor substrate, wherein a plurality of active regions formed synchronously with the chip regions being provided in the strip lines, a plurality of active regions staggered and arranged in parallel, wherein an extending direction of the plurality of active regions has an included angle in the range of 60°-80° with a row direction; and
forming a plurality of connecting structures located at ends of the active regions, by which a plurality of active regions on a same column are sequentially connected end to end, one of the plurality of active regions and corresponding connecting structures disposed at a head end and a tail end of the one of the plurality of active regions jointly constitute a "Z"-shaped test key in a column direction.

11. The method for manufacturing a semiconductor device according to claim 10, wherein
the step of forming the plurality of connecting structures comprises:
forming an insulating layer above the plurality of active regions;
forming a first connecting plug and a second connecting plug which penetrate through the insulating layer, the first connecting plug being located at a head end of a first active region, and the second connecting plug being located at a tail end of a second active region; and
forming a metal layer covering the first connecting plug and the second connecting plug, the first connecting plug and the second connecting plug being connected by the metal layer,
wherein the first and second active regions are adjacent with each other and located in a same column.

12. The method for manufacturing a semiconductor device according to claim 11, wherein
the first connecting plug and the second connecting plug have a same structure.

13. The method for manufacturing a semiconductor device according to claim 10, wherein
the semiconductor substrate comprises: a base; and shallow trench structures formed in the base, which define the plurality of active regions which are staggered arranged in parallel, and are filled with an insulating material to form a shallow trench isolation structure.

* * * * *